United States Patent [19]
Cohen

[11] Patent Number: 5,659,182
[45] Date of Patent: Aug. 19, 1997

[54] THREE-TERMINAL FUSE

[75] Inventor: Simon S. Cohen, Burlington, Mass.

[73] Assignee: Massachusetts Institute of Technology, Cambridge, Mass.

[21] Appl. No.: 454,505

[22] Filed: May 30, 1995

Related U.S. Application Data

[63] Continuation-in-part of Ser. No. 210,344, Mar. 18, 1994, Pat. No. 5,468,680.

[51] Int. Cl.$^6$ .............................. H01L 29/04; H01L 29/00
[52] U.S. Cl. .............................. 257/50; 257/529; 257/530
[58] Field of Search ............................ 257/50, 529, 530

[56] References Cited

U.S. PATENT DOCUMENTS

| | | | |
|---|---|---|---|
| 3,634,929 | 1/1972 | Yoshida et al. | 148/55 |
| 3,717,852 | 2/1973 | Abbas et al. | 148/55 |
| 3,733,690 | 5/1973 | Rizzi et al. | 437/170 |
| 4,210,875 | 7/1980 | Beasom . | |
| 4,562,639 | 1/1986 | McElroy | 437/170 |
| 4,630,355 | 12/1986 | Johnson | 437/170 |
| 4,876,220 | 10/1989 | Mohsen et al. | 437/170 |
| 5,163,180 | 11/1992 | Eltoukhy et al. | 257/530 |
| 5,281,541 | 1/1994 | Saito et al. | 437/170 |
| 5,299,151 | 3/1994 | Ishihara et al. | 365/96 |
| 5,304,508 | 4/1994 | Cohen | 437/992 |

FOREIGN PATENT DOCUMENTS

| | | |
|---|---|---|
| 0 078 165 | 5/1983 | European Pat. Off. . |
| 0 529 820 | 3/1993 | European Pat. Off. . |
| 61-230336 | 10/1986 | Japan . |
| 1186665 | 7/1989 | Japan ................... 257/529 |

OTHER PUBLICATIONS

Cohen, S.S., Raffel, J.J. and Wyatt, P.W., IEEE Electron Device Letters, vol. 13, No. 9, Sep. 1992, pp. 488–490.

Yasaitis, J.A., Electronics Letters, vol., 14, No. 15., Jun. 20, 1978, pp. 460–462.

Carlson, A.B. and Gisses, D.G., *Electrical Engineering Concepts and Applications*, Second Edition, Addison–wesley Publishing Company, Reading, MA, pp. 52–53. No date.

Liu, David K.Y., et al., "Scaled Dielectric Antifuse Structure For Field–Programmablel Gate Array Applications," IEEE electron Device Letters, vol.., 12, No. 4, Apr. 1991, pp. 151–153.

Fabula, Joseph J., RCA Technical Notes No. 976, "Semiconductor Fuse," Sep. 17, 1974, pp. 1–2.

*Primary Examiner*—Mahshid D. Saadat
*Assistant Examiner*—Valencia Martin Wallace
*Attorney, Agent, or Firm*—Hamilton, Brook, Smith & Reynolds, P.C.

[57] ABSTRACT

A device and a method for interrupting the continuity of a conductor and linking a pair of conductors are disclosed. The device is a three-terminal fuse having first and second terminals initially connected by a conductor and a third terminal separated from the conductor at a breakpoint of the conductor by an insulator. By applying a voltage across the third terminal or control terminal and the conductor, a transient conductive link is formed between the conductor and the control terminal. If sufficient current is provided through the transient link, heating of the link causes the metal of the conductor to melt and boil away, thus interrupting the continuity of the conductor.

18 Claims, 9 Drawing Sheets

THREE-TERMINAL FUSE

GOVERNMENT SUPPORT

This invention was made with government support under Contract No. F19628-90-C-0002 by the Air Force. The government has certain rights in the invention.

RELATED APPLICATIONS

This is a continuation-in-part of U.S. Ser. No. 08/210,344 filed Mar. 18, 1994, now U.S. Pat. No. 5,468,680 which is incorporated herein by reference in its entirety.

BACKGROUND OF THE INVENTION

In integrated circuit technology, it is often required to make or break electrical connections in order to fabricate and/or modify a circuit. For example, in programming logic arrays, certain gates and circuit elements must be connected while others must be isolated. Also, individual memory cells of programmable read only memories can be programmed by selectively connecting and isolating individual cells from certain conducting lines.

Various devices and methods have been developed to cut or fuse a conductor to permanently interrupt its continuity, many of which are applicable for use in integrated circuits. These prior fuses typically include a resistance within the conductive path. By passing a large enough current through the resistive fuse, the fuse is heated to a sufficient level to melt the conductive metal and boil it away. Thus, the continuity of the line is permanently interrupted.

These prior fuse devices have several drawbacks. First, they introduce their own resistance into the conductive path which, depending upon the application, can have an undesirable effect. For example, if the line is to remain intact and continue to be used as a conductor, voltage drop, power dissipation and other resistive effects of the fuse are introduced into the circuit.

Also, access to the fuse to pass a fusing current through it can be difficult. In many of these prior devices, a pair of pointed probes contact opposite sides of the fuse to apply the fusing current. These systems require that the fuse be physically accessible. In addition, the process of precisely locating the probes to blow the fuse can be slow and inefficient.

Other prior devices involve cutting the conductor with a laser. In these devices a laser beam of sufficient power to melt the conductor is directed onto the conductor. This requires that the breakpoint of the conductor be physically accessible to oftentimes bulky laser equipment. Also, once again, precisely locating the laser beam on the conductor can be a slow process.

SUMMARY OF THE INVENTION

The present invention is directed to a three-terminal fuse (TTF) device and a method for interrupting the continuity of a conductor which overcomes the drawbacks of previous devices and methods. A control electrode is located adjacent to the conductor at an eventual breakpoint of the conductor. An insulator separates the conductor from the control electrode. To fuse the conductor, a programming voltage is applied across the control electrode and the conductor. The voltage is sufficiently high to cause the insulator to break down, and a resulting transient conductive link or filament is formed between the control electrode and the conductor. While the link is present, current continues to flow through the link and the region around the breakpoint of the conductor is heated. The amount of heat generated is controlled such that the metal of the conductor melts and boils away, thus permanently interrupting the continuity of the conductor.

The transient link current is carefully controlled to provide the proper amount of heating to the region of the breakpoint. If the current through the transient link is too low, insufficient heating will result, and the conductor will not be broken. If too much current passes through the transient link, excessive heating can result in damage to the control electrode, other conducting layers, other nearby devices, etc. Control of the link current is accomplished in one embodiment with a limiting resistance placed in series with the programming voltage source and the fuse structure.

By selection of an appropriate limiting resistance value and/or programming voltage, the fuse structure of the invention can be used to either fuse the conductor or to link the conductor to the control electrode. To form a link between the conductor and control electrode, the programming voltage is applied across the conducting layers at a voltage level high enough to cause the insulator to break down to form the conductive filament between the layers. The current flowing through the link heats the region which causes the metal in the conducting layers to melt and flow such that the two metal (conducting) layers are permanently connected across the insulator by conducting metal. Alternatively, the heating process alters the electrical properties of the insulating material in the region near the filament such that it becomes permanently conductive. Thus the structure of the invention can behave like prior antifuse devices if the structure and programming method of the device are properly chosen.

If a high enough programming voltage combined with a low enough limiting resistance is used, after the insulator begins to break down, sufficient current will flow through the transient link to heat the region and boil away the conductor and destroy the transient link, thus fusing the conductor. Thus, a single device may be used to both link and cut conductors depending on the level of current applied as the link is formed.

The resistive characteristic of the transient link or filament allows sufficient power to be delivered to the region in order to fuse the conductor. If the link were a pure conductor, it would be very difficult to deliver the power, since extremely high and possibly damaging currents would be required. Thus, it is the dynamic resistive properties of the transient conductive link of the invention which allow the required power to be delivered to the breakpoint. Once the resistance of the transient link drops to a very low value, the conductor can no longer be fused using commonly available currents. The required fusing current must be delivered during the transient period.

As described above, in the present invention, it is current passing through the transient link which heats the conductor. In contrast, in the prior fusing devices, power dissipated in the series resistance of the fuse itself heated the conductor. The device of the invention provides the fusing capability without the introduction of any series resistance in the conductive path.

The device of the invention can be formed on any smooth substrate including semiconductor, glass, ceramic, etc. The conductor and control electrode can be made of any of a number of known conducting materials or combinations thereof, including aluminum, titanium, gold, platinum, molybdenum, polysilicon, etc. The insulator can be single or multi-layered and can include amorphous silicon, silicon oxide, silicon nitride, a silicon nitride—silicon oxide— silicon nitride composite, etc. Many other insulator configurations are possible; for example, all configurations described in patents assigned to Actel Corporation can be used in the device of the present invention.

The device of the invention is essentially a three-terminal fuse. Before the fusing operation, first and second terminals are connected to each other across a conductor having negligible series fuse resistance. The third terminal or control terminal is coupled to the conductor across an insulator with only minimal effect on the properties of the conductor. By applying a voltage between the third terminal and one of the first and second terminals, continuity between the first and second terminals is permanently interrupted. Thus, the device is an ideal once-programmable three-terminal switch whose resistance is sub-ohm before programming, infinite after programming and controlled by a second conductor that is completely isolated from the fuse body. It is equivalent to a once-programmable, ideal, normally closed relay and can be used in any application requiring these properties.

To reduce the amount of current required to fuse a conductor, in one embodiment of the invention, the conductor being fused is shaped to have several branches or prongs running in parallel across the breakpoint where the conductor is to be cut. Each branch includes its own respective fuse structure fabricated and programmed in accordance with the present invention. All of the branches are separated from a control electrode by a transformable insulator. To cut the conductor, a programming voltage is applied across the conductor and the control electrode, thus simultaneously applying a programming voltage to all of the fuses in that breakpoint. The insulating layer in one of the fuses will break down before the others, resulting in a current flowing through only a single transient conductive link in one of the branches of the conductor. When the current begins to flow, the applied voltage drops, thus preventing the other fuses from breaking down. When sufficient heat is generated in the area of the fuse which has reached breakdown, its corresponding conductor branch will boil away and be cut. Since the continuity of the branch is thus broken, the voltage returns to the programming level and another fuse breaks down to cut its own corresponding conductor branch. This process continues until all of the fuses have been activated to cut all of the branches, therefore completely interrupting the continuity across the entire conductor.

In this embodiment, the individual branches are preferably narrower and thinner than the main lead-in portion of the conductor entering and leaving the breakpoint. They therefore necessarily have higher resistance than the wider and thicker main conductor. To prevent degradation in the circuit properties, several branches are used in parallel such that the overall resistance of all of the branches is preferably equal to the resistance of the segment of the full-size conductor near the breakpoint. Thus, in this embodiment, the programmable fuse structure is realized with a fusing current that is a fraction of that required for a conventional wide conductor and causes no degradation in circuit operation.

In another embodiment of the invention, fusing current is substantially reduced by using an upper and/or lower conductor which includes a layer of material of relatively low thermal conductivity. The material is an electrical conductor and can be polysilicon or a refractory metal such as titanium-tungsten alloy or titanium nitride. The conductor of this embodiment also includes a layer of non-refractory metal such as aluminum. The conductor is formed as this multi-layer composite except in the region of the programmable fuse site. There, the non-refractory aluminum material is removed from the conductor, leaving only the polysilicon or refractory metal at the fuse site. Since the polysilicon or refractory metal is electrically conductive, current can still be provided to the fuse site to heat it. Also, since the polysilicon or refractory metal is a relatively poor conductor of heat, the heat generated by the current through the transient link is confined to the fuse site rather than being conducted away by non-refractory aluminum. Since heat is not conducted away, the device far more efficiently heats and fuses the conductor. Therefore, less programming current is required.

In another related embodiment, at the fuse site, the fuse structure is formed over a patch of polysilicon or refractory metal which protrudes from the conductor made of the two-layer composite of polysilicon or refractory metal and non-refractory metal. The current is conducted to the fuse site by the polysilicon or refractory metal and confined at the site to efficiently perform the fusing process.

The potential applications and uses for the three-terminal fuse of the invention are tremendously varied and widespread. Virtually anywhere a traditional two-terminal fuse, laser cutting or a three-terminal switch is used, or where prior antifuses are used, the three-terminal fuse of the invention can be used instead to improve performance. Among the applications for the device are field programmable gate arrays and multichip modules, field programmable precision resistors and capacitors, memory repair, trimmable capacitors for RF circuits, detachable test points on integrated circuits, programmable delay lines, transmission line termination trim, flat panel display repair, neural network programmable synapses, etc.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
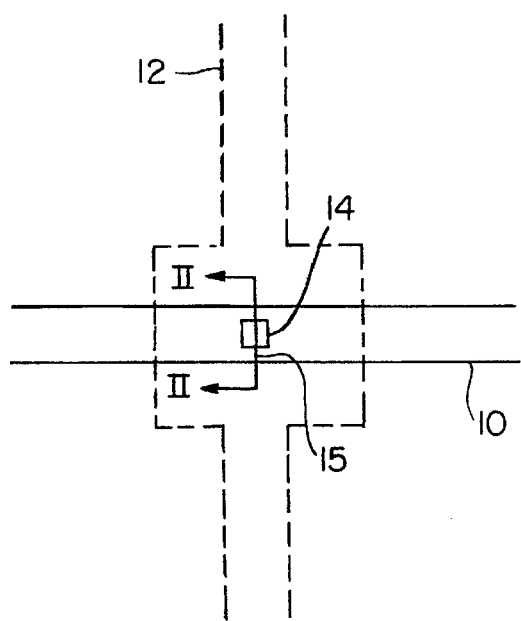
FIG. 1 is a schematic top view of a conductor and a control electrode in accordance with the present invention.

FIG. 1 is a schematic top elevational view of a small region of an integrated circuit showing a first or upper conductor 10 on the top surface of the circuit. Shown in phantom is a second or lower conductor or control electrode 12 beneath the first conductor 10. The fusing structure 14 of the present invention is located at an eventual breakpoint 15 of the conductor 10.

It should be noted that the terms upper and lower conductor or layer are used to distinguish between the conductors which are either linked or fused. In this description, the convention is that the upper layer will potentially be cut and the lower layer is used as the control electrode. However, this is not necessarily always true. The present invention contemplates that either layer can be cut and/or used as a control electrode.

Figure 2:
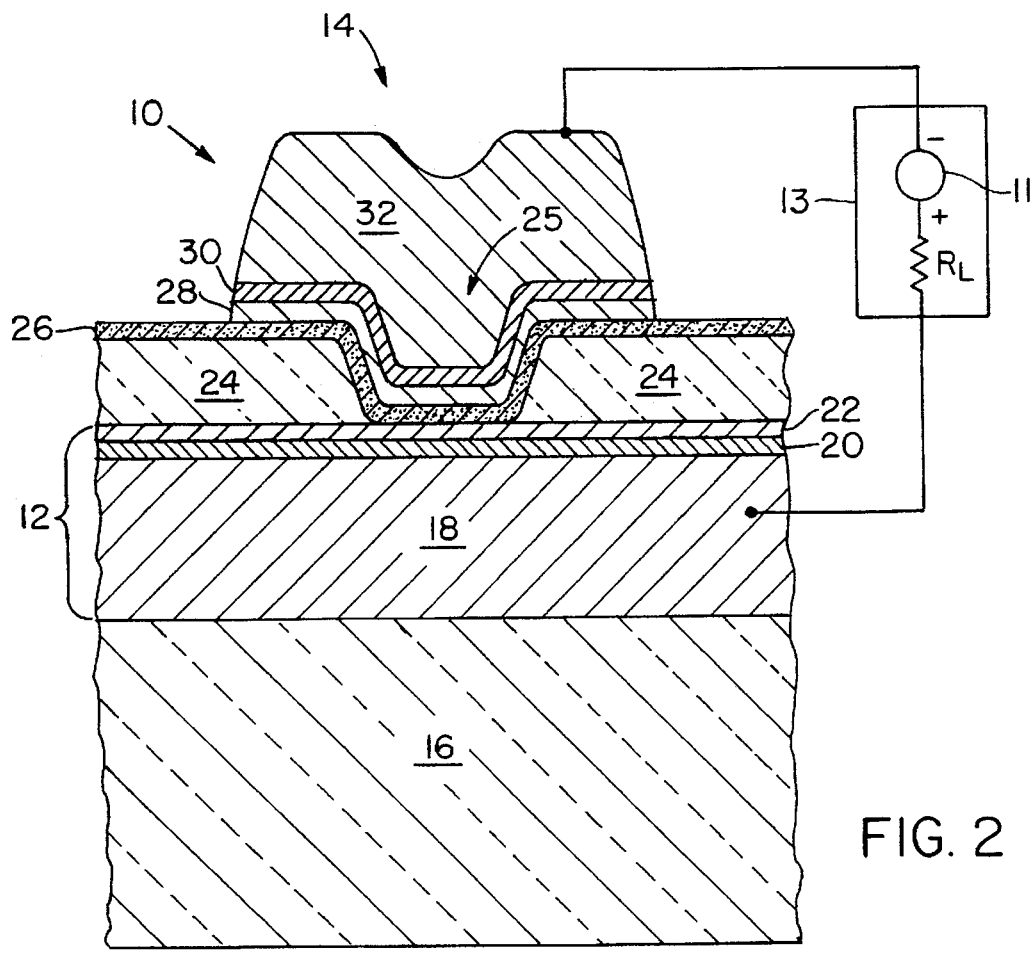
FIG. 2 is an enlarged cross-sectional view of the fuse structure of the invention taken along line II—II of FIG. 1.

FIG. 2 is an enlarged schematic cross-sectional view of the fusing structure 14 of the invention taken along cut line II—II of FIG. 1. The particular structure shown and described has been chosen because of its successful use as an antifuse device as presented in U.S. application Ser. No. 08/088,253, but any structures which present a transient link between conductors may be used. In FIG. 2, a programming circuit 13 comprising a voltage source 11 and a current limiting resistance $R_L$ is connected across the control electrode 12 and the conductor 10.

As shown in FIG. 2, the control electrode 12 is formed over a smooth substrate 16. The substrate can be a semiconductor material with an insulating overlayer including silicon dioxide, such as where the fusing device is used in conjunction with integrated circuits, or it can be any smooth substrate such as glass, ceramic, etc. In the preferred embodiment shown in FIG. 2, the control electrode 12 comprises three layers of metal. The first layer 18 is a layer of a non-refractory conductive material such as aluminum (1% silicon); the second layer 20 is a capping layer of about 10–50 nm of refractory conductive material such as titanium; and the third layer 22 is a 10–50 nm layer of aluminum (1% silicon).

An interlevel dielectric layer 24 is formed over the control electrode 12 to isolate it from the upper conductor 10. A via hole 25 is formed in the interlevel dielectric layer 24. The bottom of the via hole 25 extends to the top surface of the control electrode 12. The location of the via hole 25 defines the location of the potential breakpoint 15 (FIG. 1) of the upper conductor 10. A link insulator layer 26 is formed over of the interlevel dielectric 24. The link insulator 26 passes through the via hole 25 and contacts the top surface of the lower conductor 12. Alternatively, the link insulator may be flat on the lower conductor with the dielectric 24 over the link insulator. In that case, a suitable etch stop would be required over the link insulator. The link insulator can be a single layer of insulating material or it can be multiple layers. The insulating material can, for example, be amorphous silicon, oxide of silicon, a silicon nitride—silicon oxide—silicon nitride (NON) composite or other known insulator material. Typically, where an oxide of silicon is the insulator, it is approximately 100 Å thick. Where a NON insulator is used, each of the component layers is approximately 100 Å thick.

In the preferred embodiment, the upper conductor 10 is formed over the link insulator 26 and is a mirror image of the control electrode 12. Layer 28 is aluminum, layer 30 is titanium, and layer 32 is aluminum. Thus, within the via hole 25, the top conductor 10 is separated from the lower conductor 12 by only the link insulator layer 26.

It should be noted that either the control electrode 12 or the upper conductor 10 can have a number of configurations other than the three-layer configurations shown in the FIG. 2. For example, the conductors can be a single or double layer of other known conductive material's including aluminum, titanium, titanium-tungsten, titanium nitride, gold, platinum, molybdenum, tungsten, polysilicon, etc.

To either link the upper conductor 10 with the control electrode 12 or to break or cut the conductor 10 by fusing it, a programming voltage $V_P$ in the form of a voltage pulse is applied across the control electrode 12 and upper conductor 10 by the voltage source 11 through the current limiting resistance $R_L$. When the programming pulse $V_P$ is applied, the link insulator 26 breaks down and the transient conductive link or filament between the control electrode 12 and the conductor 10 is formed. Depending upon the programming voltage $V_P$ and the limiting resistance $R_L$, either a permanent link will be formed or conductor 10 will be cut.

If either a relatively high limiting resistance $R_L$ or a relatively low programming voltage $V_P$ or a combination of both are used, a permanent link will be formed since, during the process, the current through the transient conductive link is not sufficient to deliver enough power to the region to melt and boil away the upper conductor 10 and to destroy the transient link. Under these conditions, the transient link is transformed into a permanent conductive path and, therefore, the two conducting layers 10 and 12 are linked.

If the resistance $R_L$ is reduced and/or the programming voltage $V_P$ is increased, the conductor 10 can be fused. As with the linking process, the insulating layer 26 breaks down under the application of the programming voltage $V_P$. Once again, the transient conductive link is formed. However, in this case, the current through the link is higher than in the linking process. The increased current results in more power being dissipated at the filament during its transient resistive phase. Heating occurs and the conductive layer 10 melts and boils. If the volume of metal in the top conductor 10 in the region of the via hole 25 is small enough, it boils away such that the continuity of the conductor 10 is completely interrupted.

Figure 3:
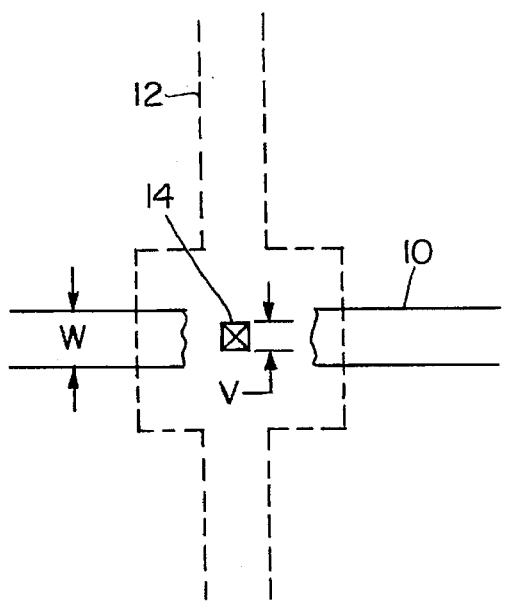
FIG. 3 is a schematic top elevational view of a conductor whose continuity has been interrupted by the fuse of the present invention.

FIG. 3 is a schematic top view of the conductor 10, control electrode 12 and the fuse structure 14 after the conductor 10 has been fused. Sufficient material has boiled away such that continuity of the conductor 10 has been destroyed.

From FIG. 3 it can be noted that the width W of the conductor 10 can affect the ability of the fuse device 14 to fuse the conductor 10. Where the via is sufficiently small and the width V of the via hole 25 approaches the width W of the conductor, the fuse device 14 will reliably fuse the conductor 10. However, if the width W of the conductor is much greater than the width V of the via hole, it becomes more difficult for the fuse structure to generate sufficient heat to melt enough metal to totally interrupt continuity. Under these circumstances, the reliability of the device is reduced. A typical via width V is 4 μm or less, specifically, between 0.2 and 2.0 ∥m. The conductor widths W must be compatible with the via widths V in order to allow the fuse to cut the conductor. Typically, for best results, the conductor should be no more than three times as wide as the via.

In order to fuse wide conductors, multiple fuse structures 14 can be formed beneath the same conductor. By applying the appropriate programming voltage to all of the fuses, continuity of the entire wide conductor can be completely interrupted.

Many variables affect the choice of limiting resistance $R_L$ and programming voltage $V_P$ required to either link or fuse the conductors. As previously mentioned, the width of the via hole 25 and the width of the conductor 10 will affect the fuse's ability to fuse the conductor 10. The thickness of the conductor 10 also has an effect. If the metal is made thin in the area of the via hole 25, less power will be required to boil it away. Therefore, the limiting resistance $R_L$ can be made larger or the programming voltage $V_P$ can be made smaller than would otherwise be required.

As described above, whether a link is formed or a conductor is fused can be controlled by controlling the amount of current which flows between conductors when the transient link or filament is established. Typically, for a NON-based link with each constituent layer being approximately 10 nm thick when a permanent link is being formed, the current is in a range of between about 5 and 10 milliamps, the programming voltage $V_P$ is between about 10 and 15 volts and the limiting resistance $R_L$ is generally above 1 kilohm. To fuse the conductor 10, the current through the transient link is typically about 100 to 300 milliamps, the programming voltage $V_P$ is between about 10 and 20 volts, and the limiting resistance $R_L$ is typically below 1 kilohm. Specifically, a typical value for resistance $R_L$ when cutting a conductor which is approximately 1 ∥m thick is approximately 100 ohms.

Ultimately, the amount of power dissipated in the transient link or filament determines whether sufficient heat will be generated to boil the conductor metal away. The maximum power will be transferred from the source 11 to the filament when the source impedance is most closely matched to the filament impedance. Therefore, it is the resistive property of the transient filament which allows the maximum power to be transferred to heat the area around the fuse structure. Since power dissipated in a resistance is given by $P=I^2R$, if the resistance of the filament is too low, sufficient power cannot be delivered to the region at safe current levels. By the same token, if the resistance is too high, sufficient current cannot flow, and once again very little power is delivered to the region.

Therefore, it is only while the filament is in the intermediate transient conductive condition with relatively high resistance, that maximum power is delivered, resulting in maximum heating effect. During this transient period, it is physically determined whether a link or a cut will be formed. If the current is high enough, then a cut will form. But, if the current is too low at that time, a link will form. Thus, it can be seen that after the transient filament portion of the process has terminated, if a permanent link has been formed, a cut cannot subsequently be formed at that position if the final link resistance is several ohms or less. This is because the permanent link has such low resistance that, at current levels which are safe and compatible with integrated circuit technology, sufficient power cannot be delivered to the region to melt the metal.

Figure 4A:
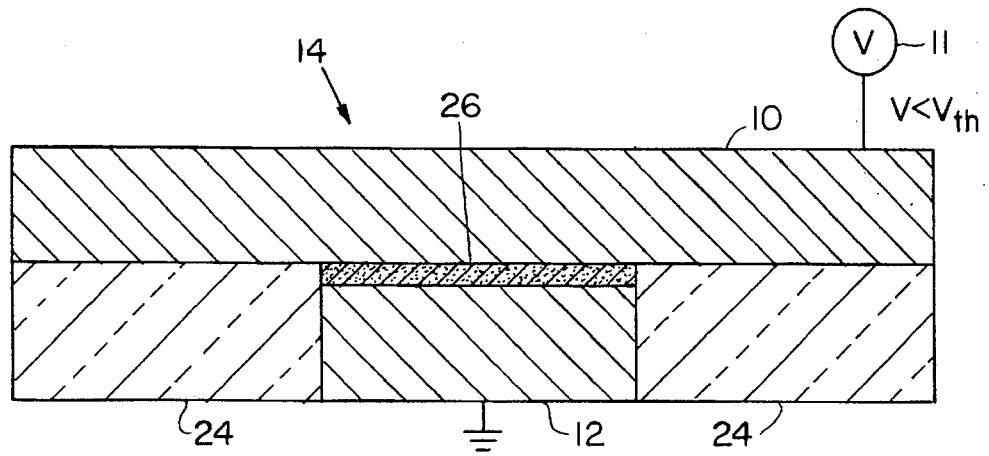
FIG. 4A is a schematic cross-sectional view of a device in accordance with the present invention before being programmed.
Figure 4B:
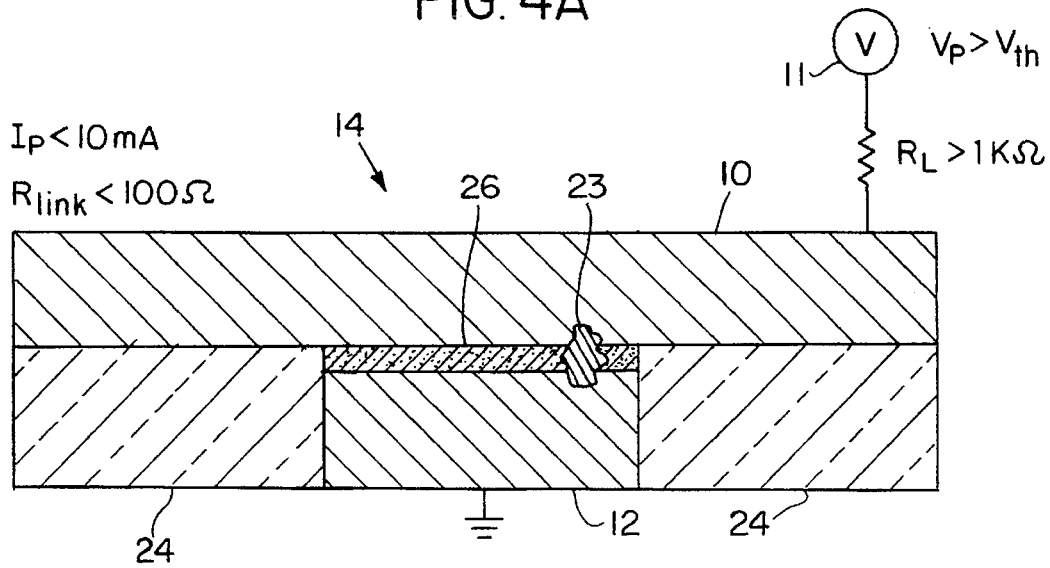
FIG. 4B is a schematic cross-sectional view of a device in accordance with the present invention after being programmed as a link.
Figure 4C:
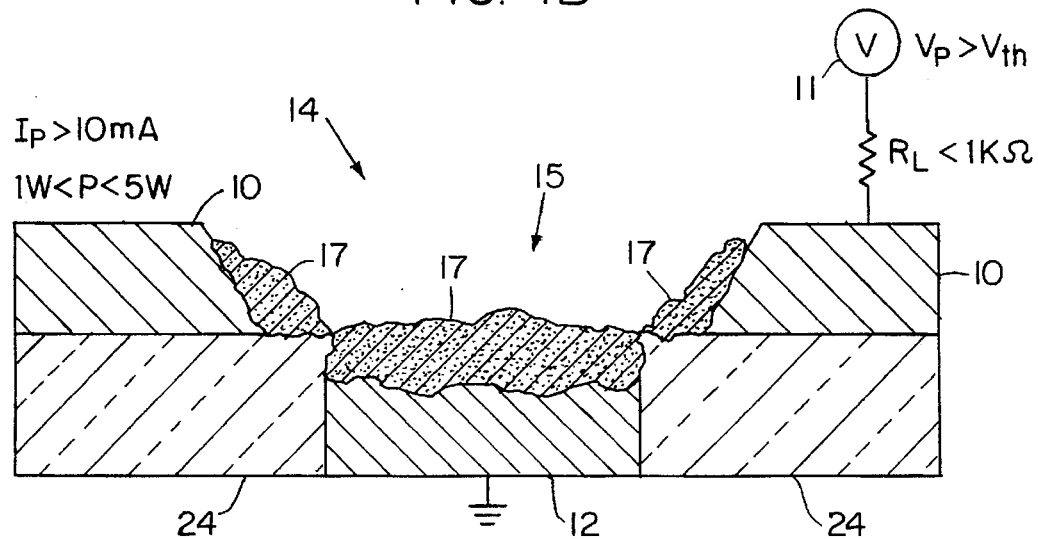
FIG. 4C is a schematic cross-sectional view of a device in accordance with the present invention after being programmed as a fuse.

FIGS. 4A–4C are schematic cross-sectional views of the fuse device 14 of the invention. The views of FIGS. 4A–4C are along a direction which is rotated 90° to the view of FIG. 2. That is, rather than looking down the length of the top conductor 10, the views of FIGS. 4A–4C look along the long side of the conductor 10. FIG. 4A shows the condition of the device 14 before programming. The voltage source 11 is applied across conductor 10 and control electrode 12. The voltage is set well below the threshold voltage $V_{th}$ of the device such that the link insulator 26 is unaffected by the voltage. For example, this would be the situation during the normal operation of an integrated circuit which functions using either a 5.5 V or a 3 V power source.

FIG. 4B shows the structure of FIG. 4A after a programming voltage $V_P > V_{th}$ is applied across a limiting resistance $R_L > 1$ kilohm. Under these conditions, after the transient filament is created, a programming current $I_P$ of approximately 10 milliamps flows through the link insulator. Sufficient heat is generated such that the metal of the conductor 10 and the metal of the control electrode 12 flow together across the insulator, leaving a permanent conductive filament 23 connecting the two conductors across the link insulator. The resulting conductive filament 23 typically has a resistance $R_{link}$ less than one ohm up to about 200 ohms.

FIG. 4C shows the structure immediately after the conductor 10 has been cut or fused. A programming voltage $V_P > V_{th}$ was applied across the conductor 10 and control electrode 12 through a limiting resistance $R_L < 1$ kilohm. A programming current $I_P > 10$ milliamps flows through the transient filament, resulting in heat sufficient to destroy conductor 10 at the break point 15. Specifically, a power P between 1 watt and 5 watts is dissipated in the region of the transient link to destroy the conductor 10 in the region whose width is on the order of 4 ∥m or less and whose thickness on the order of 1 ∥m. In addition to breaking the conductor 10, the process leaves solidified insulating magma 17 deposited into the region along the surfaces of the control electrode 12 and the cut conductor 10.

Figure 5A:
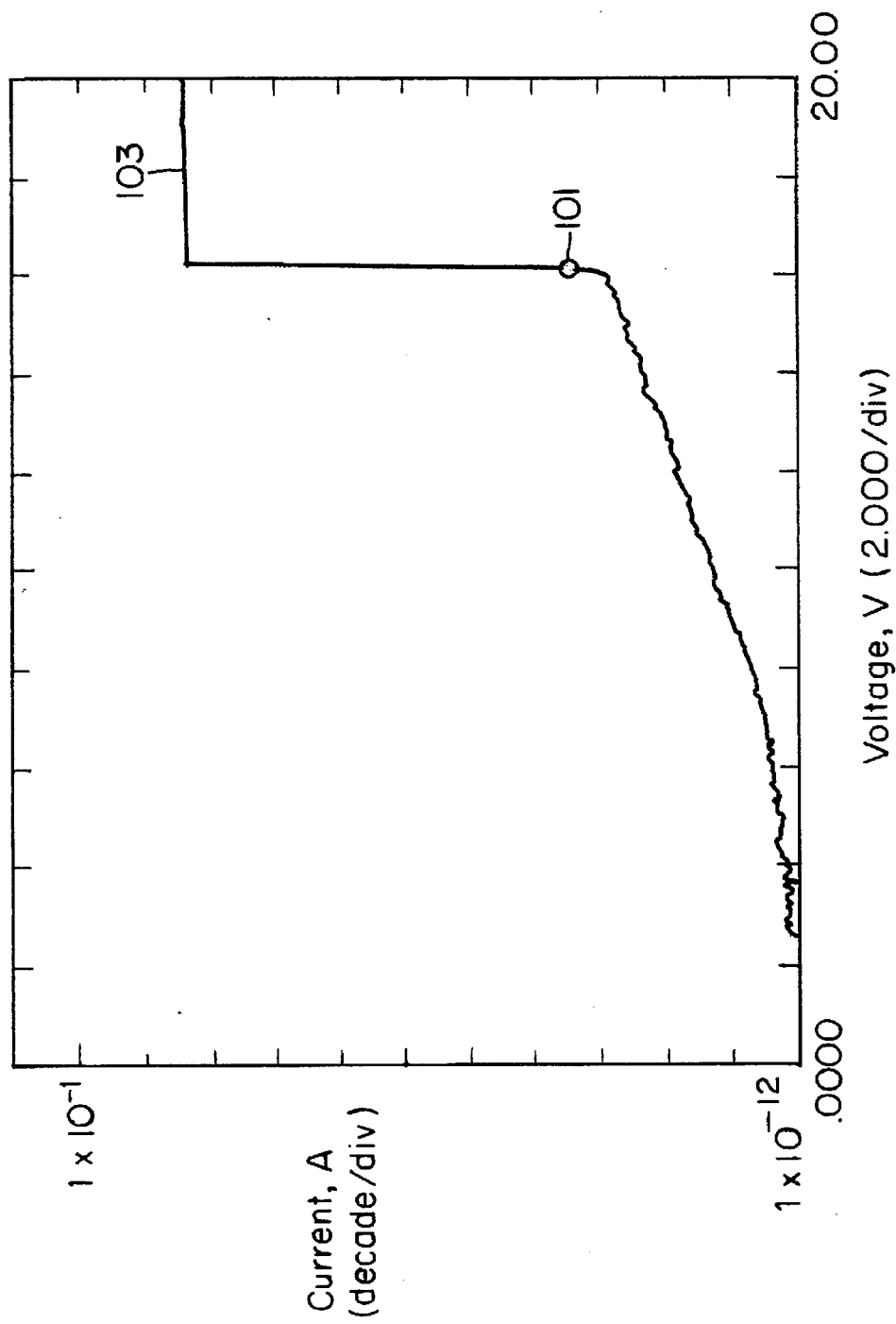
FIG. 5A is a plot of voltage applied across the conductors of the device of the invention versus the resulting current through the device for the conductor linking process of the invention.
Figure 5B:
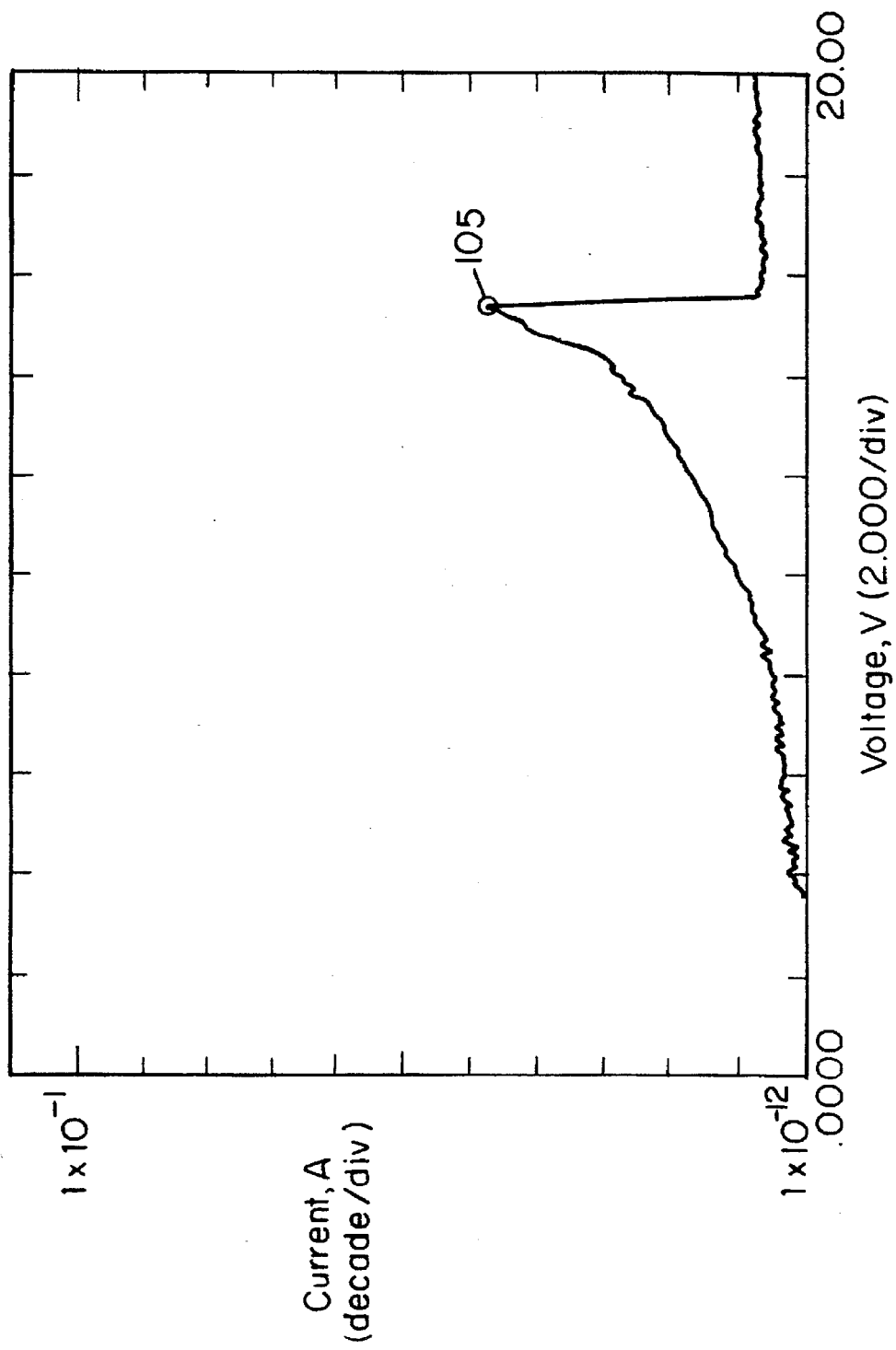
FIG. 5B is a plot of voltage applied across the conductors of the device of the invention versus the resulting current through the device for the conductor fusing process of the invention.

FIGS. 5A and 5B are plots of current through a device of the invention versus the voltage applied across the device. FIG. 5A is a plot for the case in which a link is formed, and FIG. 5B shows the case in which the conductor of the device is fused. The plots were obtained by stepping the voltage applied from 0 to 20 volts in 0.1 volt increments. The duration of time at each voltage step was approximately 0.1 second. The average time required to carry out the fusing or linking process of the invention is on the order of 0.001 second. Therefore, for purposes of the plots of FIGS. 5A and 5B, the entire fusing or linking process is carried out in a single voltage step.

FIG. 5A shows the I–V characteristic for the linking process. As shown in the graph, as the voltage is increased, the insulator begins to break down and current begins to flow. As the marker 101 indicates, at a voltage of approximately 16.2 volts, the insulator completely breaks down, the permanent link is formed and the current increases rapidly. Theoretically, the current would increase into infinity. However, the flat portion of the line at 103 indicates the current limiting of the test equipment used to perform the experiment. This test was performed with a limiting resistance $R_L$ of 5 kilohms. With such a high resistance, the current through the transient link was limited sufficiently to prevent the conductor from being boiled away. Thus, the permanent link was formed.

FIG. 5B shows a similar plot for the fusing process. Once again, the voltage is stepped from 0 to 20 volts in increments of 0.1 volt. In this case, a very low limiting resistance $R_L$ on the order of 50 ohms was used. Thus, as the voltage is increased, the current increases at a higher rate than in the linking process. As the voltage is increased, the current continues to increase as the insulator breaks down, until finally, as indicated by the marker 105, at a voltage of approximately 15.4 volts, the fusing process is completed and the current drops to a very low level. It should be noted that the curve and marker 105 indicate that the current increases to approximately 54.69 nA before the conductor is fused. However, the current actually increases to a higher level. The curve of FIG. 5B does not show this because its resolution in time is 0.1 second. With such coarse resolution in data points, the actual peak fusing current is not captured.

The fusing process described above calls for applying the programming voltage across the conductor and the control electrode. In general, the voltage can be applied to the conductor at either of the conductor fuse terminals, that is, on either side of the breakpoint. Current will flow through the via to link or fuse the conductor. It has been shown however that applying voltage to only one side of the conductor causes the transient conductive link to be formed on that side of the via. Consequently, the heating and conductor melting are concentrated on that side of the via. To generate a more symmetric cut, the conductor voltage can be applied simultaneously to both sides of the via. With symmetric heating, at a given power level, conductor cuts can more reliably be formed. This symmetric cutting is described in the commonly assigned co-pending U.S. patent application Ser. No. 08/349,933, which is incorporated herein in its entirety by reference.

Also, the foregoing description refers to a device having only two metallization layers. It will be understood that the invention is applicable to devices having any number of conductive layers. Any two of the layers can be selectively linked, or any one of the layers can be fused in accordance with the invention, as long as appropriate device processing is carried out to locate a conductor adjacent to a control electrode across a link insulator.

Figure 6:
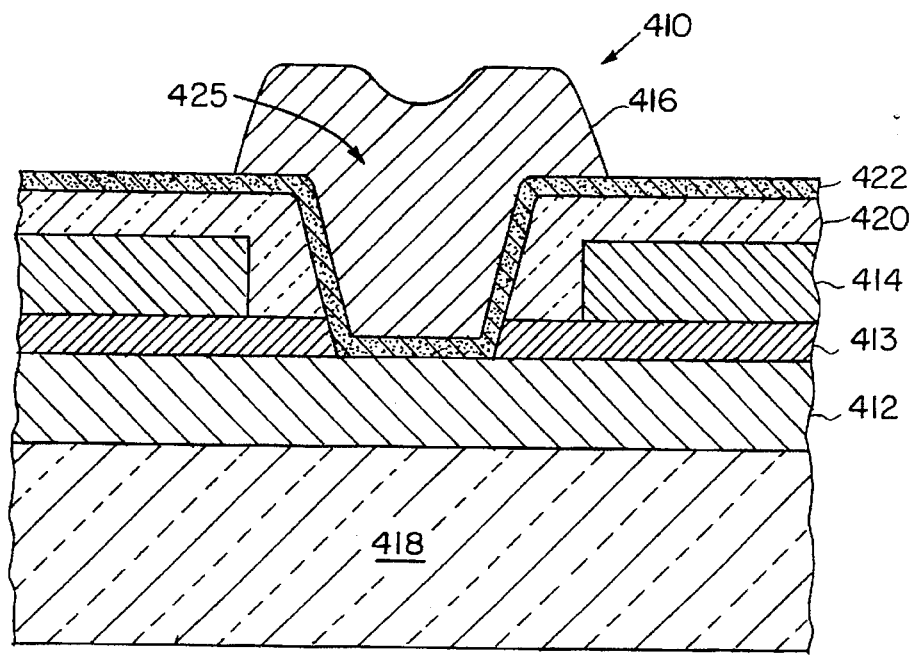
FIG. 6 is a cross-sectional view of the fuse structure of the invention used in a circuit having three conductive layers.

For example, FIG. 6 shows a fuse device 410 in accordance with the invention in a circuit having three metallization layers 412, 414 and 416 formed over a substrate 418. The device 410 has been fabricated to either fuse conductor 416 or link it to metallization layer or control electrode 412. An interlevel dielectric layer 413 separates layer 412 from layer 414. Another interlevel dielectric 420 is formed over layer 414. A via hole 425 is formed through both interlevel dielectric layers 413 and 420 down to the top surface of conductive layer 412. It should be noted that when conductive layer 414 is formed, a hole is left in the area of the fuse 410. Thus, when the via hole 425 is formed, it does not penetrate conductive layer 414. The link insulator 422 is formed over the interlevel dielectric 420 into the via hole 425 and over the top of conducting layer 412. The top conductor 416 is formed over the link insulator 422.

As in the two-conductor device previously described, the conductor 416 can be linked to the conductor or control electrode 412 by applying the programming voltage $V_P$ across the two conductors with the high-value linking limiting resistance $R_L$ in series. To fuse conductor 416, the programming voltage $V_P$ is applied with the low-value fusing resistance $R_L$.

The novel and inventive fusing device and method having been described in detail above, several systems which can be used to program the fuse and/or in which the fuse can be used will now be described in detail.

Figure 7A:
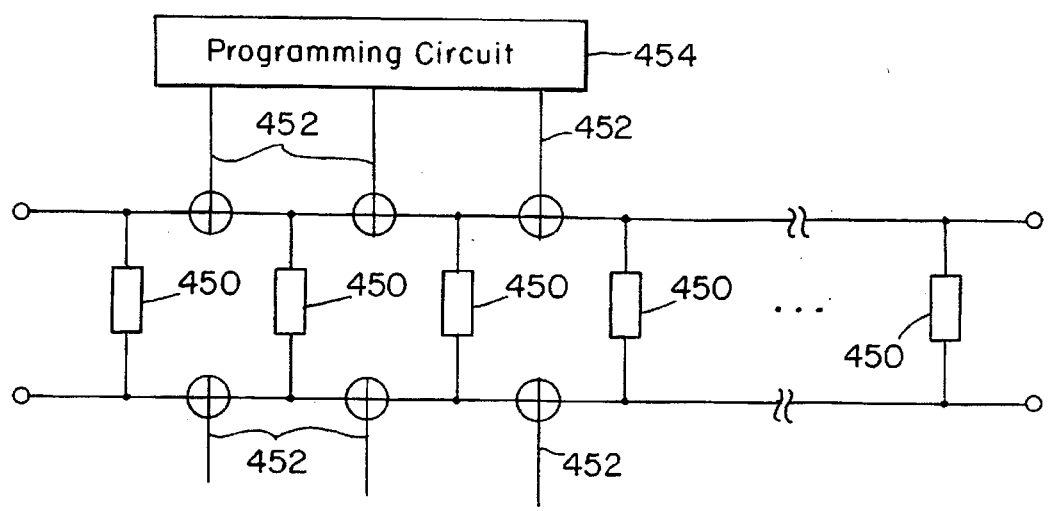
FIG. 7A is a schematic of a network of electrical components which may be connected in series or parallel using fuses of the present invention.

In one application using the three-terminal fuse described here it is possible to program any series-parallel combination of electrical components 450 such as resistors, capacitors, transistors or delay lines using the configuration shown in FIG. 7A. The control electrodes 452 from a programming circuit 454 are used to cut the horizontal buses at fuse points so that, for instance, if alternate cuts are made on the top and bottom buses, the components that were originally all in parallel would then comprise a series string. In this manner, by selecting the desired cut points, combinations of serial and parallel components can be formed by selection of the appropriate control electrodes.

Figure 7B:
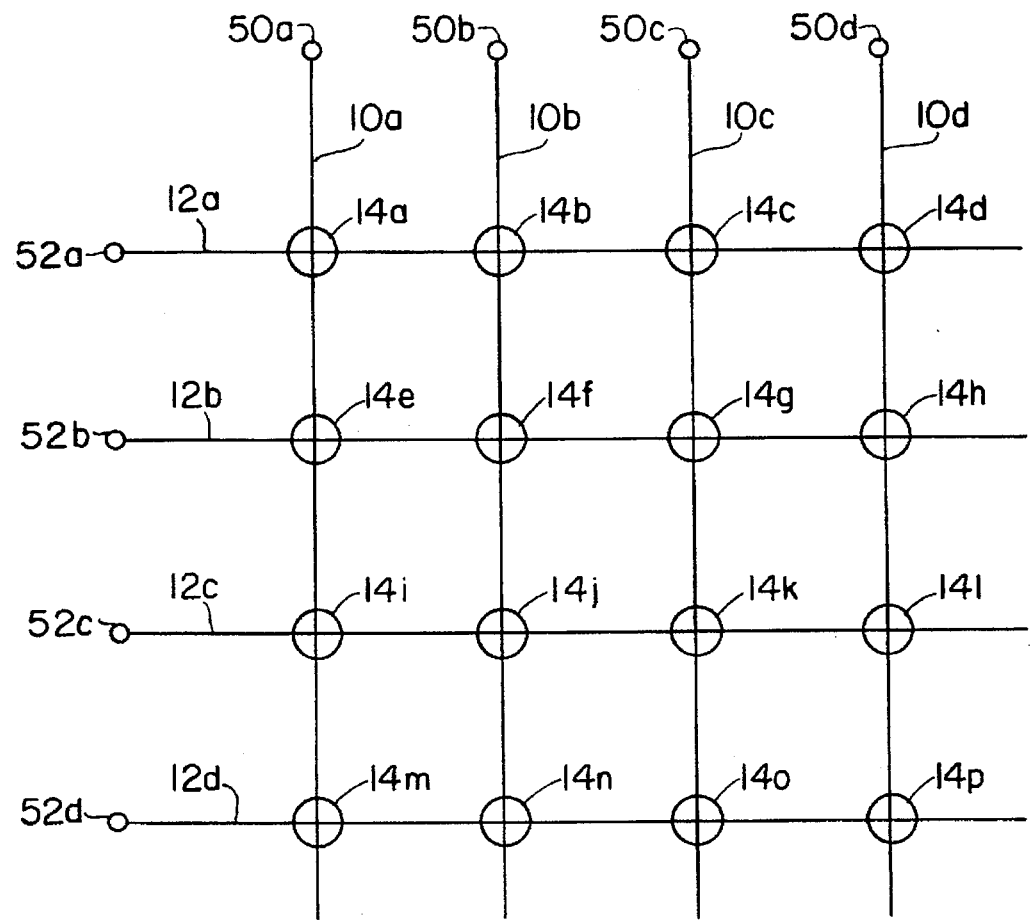
FIG. 7B is a schematic of an interconnection network using the fuse of the present invention.

Furthermore, the electronic components 450 in FIG. 7A can themselves each be a circuit of programmable series-parallel resistors, capacitors, etc. having the same network form of FIG. 7A. In this way a hierarchy of programmable interconnect can be constructed. FIG. 7B schematically illustrates an interconnection network which uses the fuse structure 14 of the invention to selectively link or cut conductors. The figure shows a grid of four control electrodes or lower conductors 12a–12d crossing four upper conductors 10a–10d at a plurality of fuse devices 14a–14p. The control electrodes 12a–12d are connected to terminals 52a–52d, respectively, and the upper conductors 10a–10d are connected to terminals 50a–50d, respectively. To activate one of the fuse structures 14, the programming voltage $V_P$ is applied across the appropriate terminals. For example, to activate fuse device 14g, the programming voltage is applied across terminals 52b and 50c. To link control electrode 12b with conductor 10c, the programming voltage $V_P$ is applied to terminal 52b and 50c through the higher source resistance $R_L$ required for maintaining the lower linking current. To cut conductor 10c instead, the programming voltage $V_P$ is applied at terminal 52b through the lower resistance $R_L$ which allows higher programming current to fuse the upper conductor 10c.

Figure 8A:
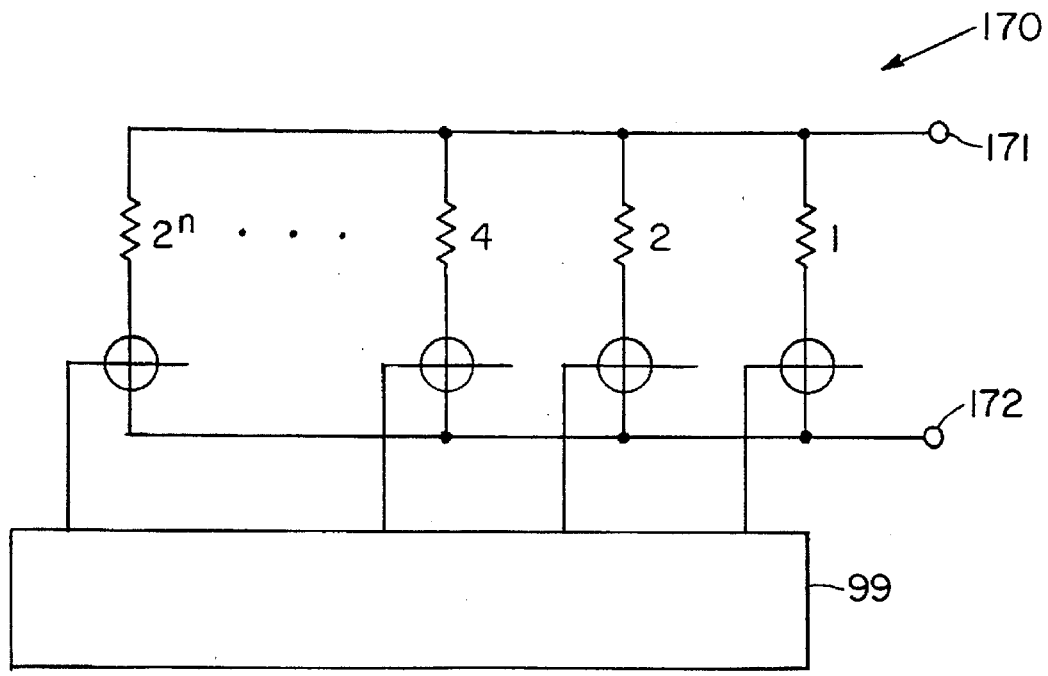
FIG. 8A is a schematic diagram of a programmable precision resistor network using fuses of the present invention and parallel resistors.
Figure 8B:
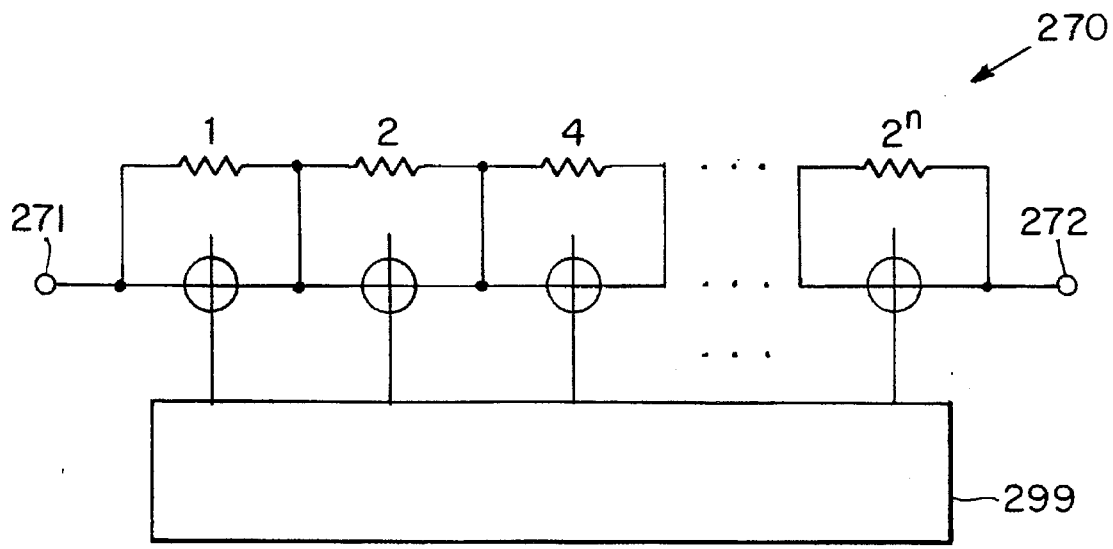
FIG. 8B is a schematic diagram of programmable precision resistor network using fuses of the present invention and series resistors.

This same architecture can be used in many different applications. For example, as shown in FIG. 8A, a programmable resistor 170 can be built whose value can be controlled to very high precision. It is accomplished by having an array of resistors fabricated in parallel on a common substrate with the fuses of the invention in series with each, controlled by a programmable fuse controller 99. If the resistors are successively doubled in value, it is possible to cover a very wide range of resistance values with very high precision. Using the fuses to selectively cut conductors and hence eliminate resistors, the total resistance between terminals 171 and 172 can be precisely set. Alternatively, the dual of this circuit as shown in FIG. 8B is a programmable resistor 270 having resistors in series with each shunted by a conductor with a three-terminal fuse in its path. It will achieve the identical result. An alternative programmable fuse controller 299 is used to selectively fuse conductors to generate the required resistance between terminals 271 and 272.

This same architecture can also be used to build programmable capacitors or transistors with programmable transconductance. It can also be used to build a programmable delay line by selectively cutting shunts across sections of tapped delay line so that the total delay is equal to the sum of the delays through the unshunted sections.

The fuse of the invention as described hitherto employs one breakpoint site per event of conductor continuity interruption. Since the conductor at the breakpoint site must have the same overall electrical properties as along its entire length in order to minimize lead-in resistance and maintain device reliability, it has the same width, thickness, and composition at the breakpoint site as it has elsewhere. These characteristics of the conductor at the breakpoint also affect the programming current needed to cut a commonly used conductor.

Figure 9:
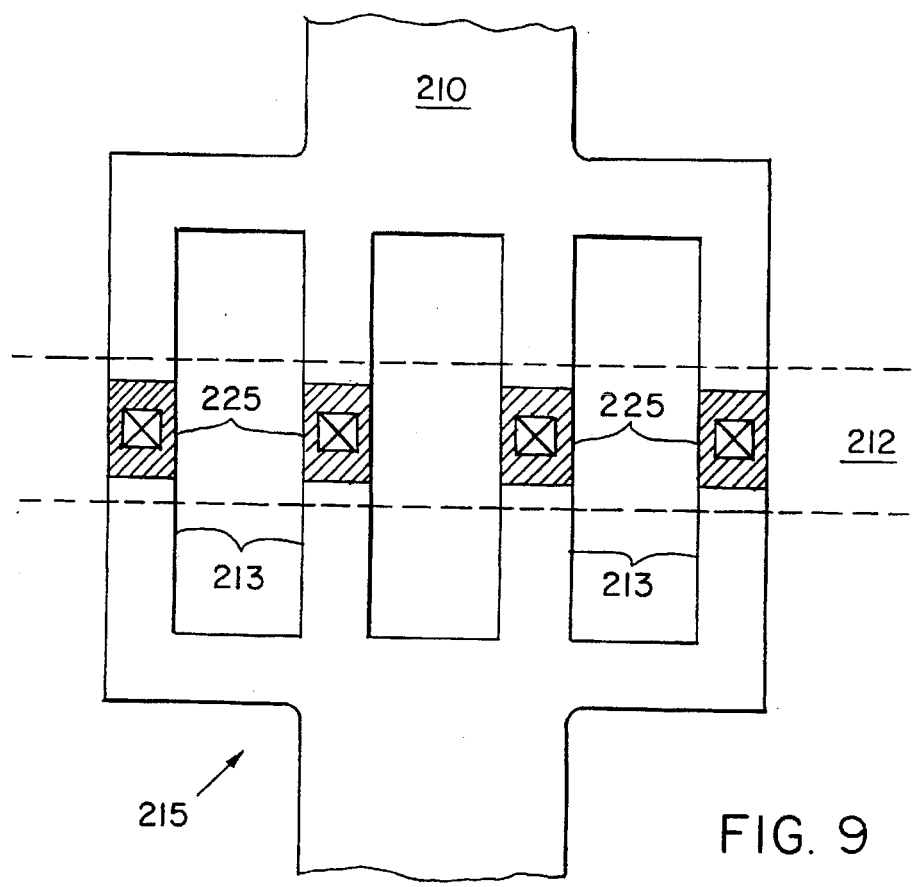
FIG. 9 is a schematic top elevational view of a multi-pronged conductor whose continuity may be interrupted by several fuses of the present invention.

An alternative preferred embodiment of the present invention is directed to lowering the necessary programming current. FIG. 9 is a schematic top elevational view of an alternative conductor structure to be fused using a low current source. In this embodiment, at the fusing site 215, the upper conductor 210 is split into plural prongs or branches 215 each passing over or connected to a link site 225. The prongs 213 are designed such that together, they have the same current carrying capability as the main lead in conductor 210 so that the overall resistance and reliability of the device is not affected. However, because each of the prongs 213 is narrower and thinner than the main conductor 210, the current required to interrupt the continuity of a prong 213 is only a fraction of that needed to interrupt the continuity of the main conductor 210. The dimensions of each prong 213 are determined by the desirable current reduction factor. A circuit is typically designed to operate with a maximum current source of about 20 milliamperes. Hence, each individual prong 213 is amenable to fusing at such a current level.

A prong 213 is thus reduced in both its width and thickness as compared with the main conductor 210. This means that the typical prong 213 will be more resistive than the main conductor 210. Hence, a number of prongs 213, situated in parallel, are used to render the overall structure to be of the same low resistance as would be the case if only the main conductor 210 was utilized.

To achieve the desired cutting of the main upper conductor 210, an appropriate voltage is applied between upper conductor 210 and lower conductor 212. First, one of the link sites 225 undergoes a breakdown during which time the voltage will drop considerably. However, once the cutting process described above has been completed on the prong 213 associated with the single link site 225 undergoing breakdown, the continuity of that prong 213 is interrupted, and the voltage climbs back to its set value. At this point a second link site 225, involving one of the remaining prongs 213, goes through the same process and the continuity of the second prong 213 is thus interrupted. The process continues until the continuity of all of the prongs 213 has been interrupted, leading to a final fusing of the main conductor 210. Thus, the entire conductor 210 is cut one prong at a time using a fusing current that is considerably lower than that which would be required to cut the entire conductor 210 all at once.

Figure 10:
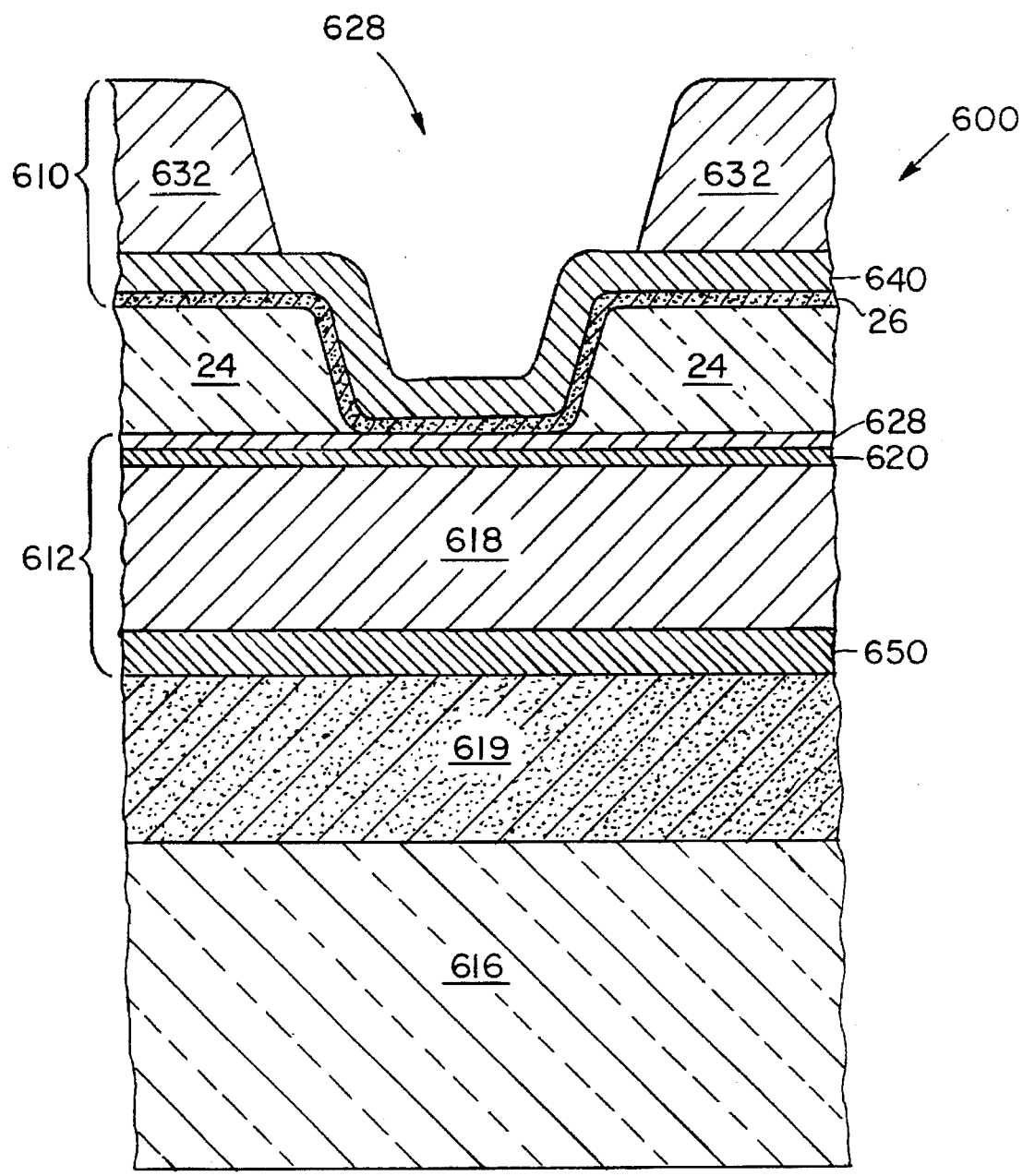
FIG. 10 is a schematic cross-sectional view of an alternative embodiment of the fuse structure of the present invention.

FIG. 10 is a schematic cross-sectional view of an alternative preferred embodiment 600 of the fuse structure of the invention. This alternative fuse structure is programmable at a lower current than the embodiment described above, and it can be used in any of the devices described herein, including the multi-prong conductor structure described above in connection with FIG. 9.

As depicted in FIG. 10, the upper conductor 610 is preferably made of a first thin (about 1,000 521 ) refractory metal 640 such as TiN or TiW under a thick (about 7,000 Å) second metal 632, preferably made of an aluminum alloy. Alternatively, layer 640 can be made of polysilicon. Also, layer 632 can be the three-layer structure described above comprising a layer of refractory metal sandwiched between two layers of non-refractory metal. The upper conductor 610 is separated from the lower conductor 612 by the interlevel dielectric layer 24 and transformable insulator layer 26 described above. The lower conductor 612 is isolated from the substrate 616 by a field insulator layer 619.

The lower conductor 612 preferably includes four layers of metal. Preferably, the four layers include a thin layer (about 200 Å) of non-refractory metal 628 such as aluminum over a thin layer (about 100 Å) of refractory metal 620 such as titanium over a thick layer (about 7,000 Å) of non-refractory metal 618 over a relatively thick layer (about 1,000 Å) of refractory metal 650 such as titanium nitride or titanium-tungsten alloy. Alternatively, the layer 650 can be made of polysilicon. At the link site 625 the conductor layer 632 is removed so that the power required to cut the conductor 610 at the link site 625 is reduced. That is, since only the thin refractory metal or polysilicon layer 640 at the link site 625 needs to be boiled away to complete fusing of the upper conductor 610, a relatively small amount of power is required. In an alternative embodiment, it may be necessary to leave the conductor layer 632 intact within the via hole to ensure that local thinning of the metal layers at the walls of the via does not cause premature cessation of the fusing process before the conductor can be completely cut.

The use of polysilicon or refractory conductors such as TiN and TiW as layer 640 is advantageous because of their poor thermal conductivity relative to that of aluminum. Thus, heat generated during the breakdown at the link site 625 is not as easily conducted away from the link site and is available for raising the temperature at the link site to facilitate cutting.

The fuse structure of FIG. 10 can be employed in the conductor configuration of FIG. 9 to reduce heat conduction from the fuse site, thereby further lowering the power required to effect fusing. With the aluminum layer from the prongs 213 of conductor 210 removed, heat will be confined to the fuse sites.

Figure 11:
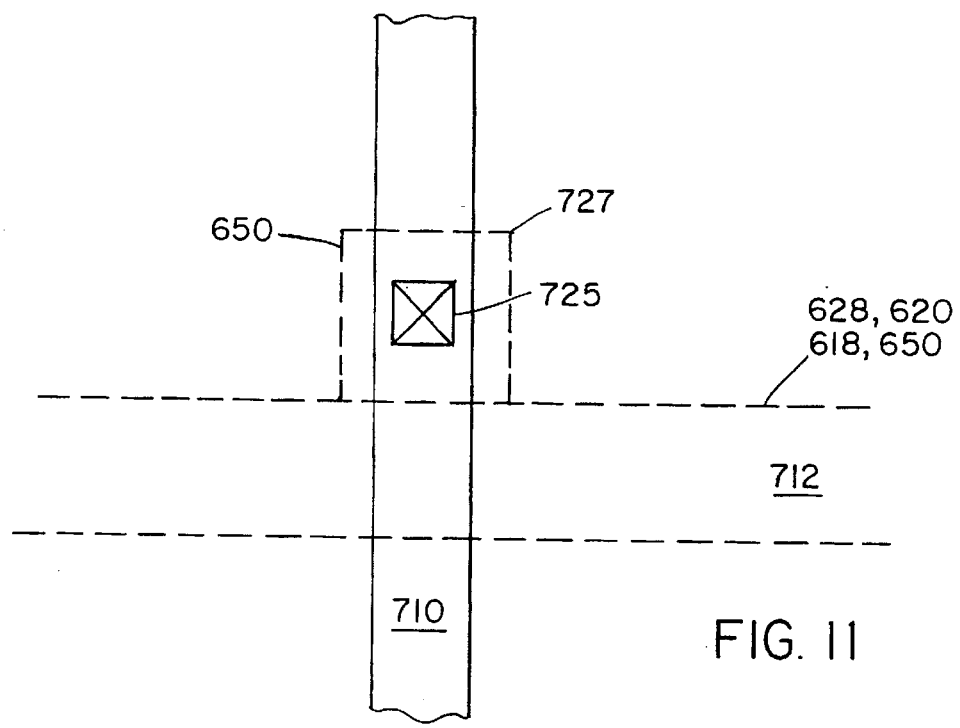
FIG. 11 is a schematic top elevational view of a conductor configuration using the fuse structure of the present invention.

To prevent degradation of the overall electrical properties of the upper conductor 610 of the fuse structure of FIG. 10, the fuse structure can be constructed on a side protrusion from conductor 612 that does not include the layers 618, 620 and 628. FIG. 11 is a schematic top view of a fuse site 725 realized on such a protrusion 727 made of the polysilicon or refractory TiN or TiW layer 650 only. In FIG. 11, 712 indicates the lower conductor made of the four metal layers 628, 620, 618 and 650 shown in FIG. 10. The notch 727 is a portion of the lower conductor in which metal layers 628, 620 and 618 have been removed, leaving only the polysilicon refractory layer 650. To prepare such a fuse structure, the thin polysilicon or refractory metal 650 is deposited followed by layers 618, 620 ad 628. The combined layer 712 is then shaped according to the required pattern with the notch or protrusion 727. The main conductor line 712 is protected while the area of the notch 727 is exposed to an etchant that dissolves layers 628, 620 and 618 of the conductor 712 while leaving behind layer 650 with notch 727 attached to the main conductor 712. The fuse structure 725 is then fabricated as shown on top of the notch 727. The notch 727 is not an efficient heat conductor; therefore, heat is confined to the area of the notch, resulting in a reduction in the amount of energy required to effect fusing.

The schematic drawings of FIGS. 9–11 describe some of the salient features of the multiple-prong three-terminal fuse of the invention. The particular configurations of the conductors of the link site would preferably be selected to ensure symmetric cutting of the link site in accordance with the description contained in the commonly assigned co-pending U.S. patent application Ser. No. 08/349,933, which is incorporated herein in its entirety by reference.

It will be understood that any of the features of FIGS. 9–11 can be used alone or in combination in any embodiments of the invention described herein. Also, it will be understood that the convention used herein to describe upper and lower conductors is not critical to the invention. The various conductor and circuit structures and configurations apply to either of the conductor layers. For example, referring to FIG. 9, the lower conductor 212 can be formed with multiple prongs instead of, or in addition to, the upper conductor 210. Also, referring to FIG. 10, the lower conductor layers 628, 620 and 618 can be removed near the link site 625 to provide the same heat confinement benefits realized when the upper conductor 632 is removed.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A fuse system for interrupting the continuity of a conductor at a breakpoint comprising:

a control electrode adjacent to the breakpoint;

an insulator between the conductor and the control electrode; and a programming circuit for applying a programming voltage across the insulator between the conductor and the control electrode, the programming voltage being such that a transient conductive link is formed between the conductor and the control electrode, the programming circuit providing sufficient current through the transient conductive link to generate sufficient heat around the transient conductive link to destroy and thus interrupt the continuity of the conductor at the breakpoint.

2. The system of claim 1 wherein the insulator comprises amorphous silicon.

3. The system of claim 1 wherein the insulator comprises silicon oxide.

4. The system of claim 1 wherein the insulator comprises a silicon nitride—silicon oxide—silicon nitride composite.

5. The system of claim 1 further wherein the programming circuit comprises:

a voltage source; and a limiting resistance in series with the control electrode, conductor and insulator for limiting current through the insulator.

6. A system for selectively cutting a first conductor at a breakpoint or linking the first conductor to a second conductor comprising:

an insulator between the first conductor and the second conductor, the first conductor being adjacent to the second conductor across the insulator at the breakpoint;

an adjustable programming circuit for applying a programming voltage across the first and second conductors such that upon application of the programming voltage, a transient conductive link is formed between the first and second conductors; and wherein the programming circuit is adapted to provide sufficient current through the transient conductive link to generate sufficient heat around the transient conductive link to destroy the first conductor; and the programming circuit is adapted to limit current flowing through the transient conductive link such that heating around the transient conductive link is not sufficient to destroy the first conductor.

7. A programmable interconnection network comprising:

a plurality of conductors;

a plurality of control electrodes adjacent to the conductors at a plurality of breakpoints of the conductors, each control electrode being separated from a conductor at a breakpoint by an insulator;

a programming circuit for applying a programming voltage across a conductor and a control electrode such that upon application of a voltage across an insulator between a corresponding conductor and control electrode, a transient conductive link between the conductor and control electrode is formed through the insulator, the programming circuit providing sufficient current through the transient conductive link to generate sufficient heat in a region around the transient conductive link to destroy the conductor at the breakpoint.

8. The programmable interconnection network of claim 7 further comprising a plurality of electrical components connected in parallel conductive paths across first and second terminals, such that destroying conductors in selected conductive paths programs an electrical network of the electrical components in a preselected series/parallel arrangement.

9. A programmable integrated circuit comprising:

a conductor comprising multiple conductive branches connected in parallel;

a control electrode adjacent to each branch of the conductor;

an insulator between the control electrode and each branch; and a programming circuit for programming the integrated circuit by applying a voltage across the insulator between the conductor and the control electrode to create a transient conductive link between the control electrode and at least one branch of the conductor at a time while applying sufficient current through the transient conductive link to heat around the link sufficiently to cut across the branch of the conductor, the voltage being applied for a duration sufficient to allow all of the branches to be cut.

10. A programmable fuse system comprising:

a conductor comprising a first layer of non-refractory metal over a second layer of material of relatively low thermal conductivity, the non-refractory metal being selectively removed from the conductor in proximity to a fuse site;

a control electrode adjacent to the fuse site;

an insulator between the first conductor and the control electrode at the fuse site; and a programming circuit for applying a voltage across the insulator between the conductor and the control electrode to create a transient conductive link at the fuse site between the control electrode and the second layer of the conductor to heat around the fuse site sufficiently to cut across the conductor to interrupt the continuity of the conductor.

11. The programmable fuse system of claim 10 wherein the second layer of the conductor comprises a refractory metal.

12. The programmable fuse system of claim 10 wherein the second layer of the conductor comprises TiN.

13. The programmable fuse system of claim 10 wherein the second layer of the conductor comprises TiW.

14. The programmable fuse system of claim 10 wherein the second layer of the conductor comprises polysilicon.

15. The programmable fuse system of claim 10 comprising a protrusion of the control electrode over which the fuse structure is formed.

16. The programmable fuse system of claim 15 wherein the control electrode comprises a non-refractory metal layer over a refractory metal layer and the non-refractive layer is reduced in the protrusion.

17. The programmable interconnection network of claim 7 where at least one of said conductors is segmented into parallel conductor segments connected to have a common programming voltage applied thereacross.

18. A fuse system as claimed in claim 1 wherein the control electrode comprises a protrusion over which the fuse structure is formed.

* * * * *